US010777617B2

(12) United States Patent
Safaee et al.

(10) Patent No.: US 10,777,617 B2
(45) Date of Patent: Sep. 15, 2020

(54) DISPLAY, A CIRCUIT ARRANGEMENT FOR A DISPLAY, AND A METHOD OF OPERATING A CIRCUIT ARRANGEMENT OF A DISPLAY

(71) Applicant: OSRAM Opto Semiconductors GmbH, Regensburg (DE)

(72) Inventors: Alireza Safaee, Cupertino, CA (US); Marcel Severin, Regensburg (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 20 days.

(21) Appl. No.: 16/194,233

(22) Filed: Nov. 16, 2018

(65) Prior Publication Data

US 2020/0161376 A1    May 21, 2020

(51) Int. Cl.
| | |
|---|---|
| *H01L 27/32* | (2006.01) |
| *G09G 3/3216* | (2016.01) |
| *H01L 27/15* | (2006.01) |
| *G09G 3/3283* | (2016.01) |

(52) U.S. Cl.
CPC ......... *H01L 27/322* (2013.01); *G09G 3/3216* (2013.01); *G09G 3/3283* (2013.01); *H01L 27/156* (2013.01); *H01L 27/3246* (2013.01)

(58) Field of Classification Search
USPC .......................................................... 345/83
See application file for complete search history.

(56) References Cited

U.S. PATENT DOCUMENTS

| | | | | |
|---|---|---|---|---|
| 6,618,031 | B1* | 9/2003 | Bohn, Jr. ............... | H05B 45/37 345/83 |
| 2002/0163514 | A1* | 11/2002 | Nagai ................... | G09G 3/3216 345/204 |
| 2006/0192728 | A1* | 8/2006 | Kim ....................... | H05B 45/37 345/46 |
| 2013/0093358 | A1* | 4/2013 | Lin ......................... | G09G 3/32 315/307 |
| 2015/0156829 | A1* | 6/2015 | Lin ...................... | G09G 3/3216 315/192 |
| 2016/0260375 | A1* | 9/2016 | Ruan ........................ | G09G 3/32 |
| 2017/0069270 | A1* | 3/2017 | Hyeon ................. | G09G 3/3216 |
| 2019/0147795 | A1* | 5/2019 | Yao .......................... | G09G 3/32 345/691 |

FOREIGN PATENT DOCUMENTS

| | | |
|---|---|---|
| CN | 105938703 A | 9/2016 |
| DE | 102005039538 A1 | 2/2007 |
| WO | 2004025609 A2 | 3/2004 |

* cited by examiner

*Primary Examiner* — Chineyere D Wills-Burns
(74) *Attorney, Agent, or Firm* — Slater Matsil, LLP

(57) ABSTRACT

A display, a circuit arrangement for a display and a method of operating a circuit arrangement of a display are disclosed. In an embodiment a display includes a plurality of light emitters arranged in a plurality of rows and columns, each row including an electric line and each column including an electric line, a voltage supply for providing a first voltage level to the electric lines of the rows and a second voltage level to the electric lines of the columns and a light emitter arranged in a first row and a first column and interconnecting the electric line of the first row and the electric line of the first column, wherein the electric line of the first column includes a current source, the current source being adapted to be switched on and off and to provide an electric current to drive the light emitter.

15 Claims, 13 Drawing Sheets

DISPLAY, A CIRCUIT ARRANGEMENT FOR A DISPLAY, AND A METHOD OF OPERATING A CIRCUIT ARRANGEMENT OF A DISPLAY

TECHNICAL FIELD

The present invention relates to displays, circuit arrangements for displays and methods of operating a circuit arrangement of a display.

BACKGROUND

Displays that use a plurality of pixels which are arranged in a plurality of rows and columns are widely used. Each pixel can comprise a plurality of LEDs with each LED being adapted to emit light at a different wavelength. For example, so-called RGB LEDs include an array of pixels in which each pixel comprises three LEDs per pixel. One LED is configured to emit red light, one LED is configured to emit green light, and one LED is configured to emit blue light. The red, green and blue light can be added together to produce a desired color defined by the primary RGB colors.

For example, on displays that use RGB LED pixels, undesirable visual effects known as ghosting may occur.

There is a need for a display in which such undesirable ghosting effects are reduced or even eliminated.

SUMMARY

Displays, circuit arrangements for a display, and methods of operating a circuit arrangement of a display are provided. In some examples, a display comprises a plurality of light emitters, such as a plurality of LEDs, arranged in a plurality of rows and columns, each row comprising an electric line and each column comprising an electric line. The display further comprises a voltage supply for providing a first voltage level to the electric lines of the rows of the plurality of rows and a second voltage level to the electric lines of the columns of the plurality of columns, wherein the first voltage level is provided repeatedly and in a consecutive order to the electric lines of the rows. A light emitter, such as a LED, is arranged in a first row and in a first column, and the light emitter interconnects the electric line of the first row and the electric line of the first column. The electric line of the first column comprises a current source which is adapted to be switched on and off and to provide an electric current to drive the light emitter to a predetermined period of time when the first voltage level is applied to the first row. The electric line of the first column has a node at which the electric line is connected to a first auxiliary electric line which is connected at a first connection point to the first voltage level, and the first auxiliary electric line comprises an auxiliary switch between the node and the first connection point, the auxiliary switch is switchable in dependence on the switching-off of the current source.

In some examples, the auxiliary switch may be switched to close the electric path of the first auxiliary electric line at the same time as the current source is switched off. There may also be a short time delay between the switching of the auxiliary switch and the switching-off of the current source. The display may therefore be robust in small variations and may be insensitive to small manufacturing tolerances of the used components in the system.

Thus, the auxiliary switch allows closing the first auxiliary electric line in dependence on the switching-off of the current source. The first auxiliary electric line may therefore provide a path for an electric current by which a parasitic capacitor in the circuit may be discharged. The parasitic capacitor may, for example, be present in a pn-junction of the light emitter. Due to the discharging of the parasitic capacitor, it is possible to avoid or reduce a parasitic ghosting effect which may lead to an undesired lighting up of the light emitter during time intervals in which the light emitter is supposed to be switched off. Switching times of the rows can, for example, be around 20 microseconds.

In some examples, the first auxiliary electric line further comprises an inductor between the node and first connection point. The at least one parasitic capacitance and the inductor may act as an LC-circuit once the auxiliary switch has been closed. The electric energy comprised in the parasitic capacitance may be stored by use of the inductor and may further be made available to the voltage supply. Thus, beyond reducing or even avoiding ghosting effects, electric energy stored in the parasitic capacitances can be recuperated and provided to the voltage supply, which may be a DC voltage supply.

In some examples, the first auxiliary electric line comprises a first diode with the first diode and the auxiliary switch being closer to the first connection point than the inductor. The first diode allows controlling the direction of the current flow.

In some examples, the first auxiliary electric line comprises a second connection point between the inductor on one side of the second connection point and the auxiliary switch and the first diode on the other side of the second connection point.

In some examples, a second auxiliary electric line connects the second connection point to the second voltage level, which may correspond to the ground level or to a level above the ground level, which may be in the range between 3.5 V and 0 V, for example. The second auxiliary electric line may further include at least a second diode. The second diode also allows controlling the direction of the current flow through the second auxiliary electric line.

In some examples, the electric line of the first column comprises a third connection point, in particular between the current source and the light emitter. The third connection point and the node are, at least in substance, at the same electric potential, and a third auxiliary electric line connects the third connection point to the second voltage level, and the third auxiliary electric line may include at least a third diode. The third diode allows controlling the direction of the current flowing through the third auxiliary electric line.

In some examples, the auxiliary switch may be switchable in dependence on a switching rate of the first voltage level between consecutive rows. This may be advantageous with regard to the avoidance of ghosting effects and the recuperation of electric energy stored in parasitic capacitances in the electric circuit and/or in pn-junctions of the light emitters arranged in the electric circuit.

In some examples, a display comprises a plurality of light emitters arranged in a plurality of rows and columns, each row comprising an electric line and each column comprising an electric line. The display further comprises a voltage supply for providing a first voltage level to the electric lines of the rows of the plurality of rows and for providing a second voltage level to the electric lines of the columns of the plurality of columns, wherein the first voltage level is provided repeatedly and in a consecutive order to the electric lines of the rows. The electric line of a first row of the plurality of rows comprises a second node at which the electric line of the first row is connected to a fourth auxiliary electric line, the fourth auxiliary electric line being connected at a fourth connection point to the second voltage level, and the first auxiliary electric line comprising a second auxiliary switch between the second node and the fourth connection point, the second auxiliary switch being switchable in dependence on a switching-off of the first voltage level applied to the first row. Different displays may employ different frame rates and refresh rates. Thus, different displays may also use different switching frequencies. A robustness in small variations and an insensitivity to manufacturing tolerances of the used components of the display is therefore advantageous.

In some example, the second auxiliary switch may be switched to close the electric path of the fourth auxiliary electric line at the same time as the first voltage level is removed from the first row. There may also be a short time delay between the switching of the second auxiliary switch and the removal of the first voltage level from the particular row. In particular, the second auxiliary switch may be closed in dependence on a switching-off of the first voltage level applied to the first row. Thereby, the fourth auxiliary electric line may be used to discharge parasitic capacitances in the electric circuitry and/or in the pn-junctions of the light emitters. Ghosting effects of the light emitters can thereby be avoided.

In some examples, the electric line of the first row is connected to a terminal of the voltage source for providing the first voltage level to the electric line of the first row, and the electric line comprises a switch for connecting and disconnecting the electric line of the first row of the voltage source. The second auxiliary switch is in particular switchable in dependence on the disconnecting of the electric line of the first row from the terminal of the voltage source. The second auxiliary switch may therefore be switchable in dependence on the switching of the switch, and the parasitic capacitances may be discharged in dependence on the switching of the electric voltage applied consecutively to the electric lines of the plurality of rows.

In some examples, the fourth auxiliary electric line comprises an inductor between the second node and the fourth connection point. The inductor and the parasitic capacitances in the circuit or in the light emitters may act as a LC-circuit. The electric energy stored in the parasitic capacitances may therefore be saved by use of the inductor and provided to the voltage supply.

In some examples, the fourth auxiliary electric line further comprises a fourth diode, wherein the fourth diode and the second auxiliary switch are closer to the fourth connection point than the inductor. The first diode can be used to control the direction of the current flowing through the fourth auxiliary electric line.

In some examples, the fourth auxiliary electric line comprises a fifth connection point between the inductor on one side of the fifth connection point and the second auxiliary switch and the fourth diode on the other side of the fifth connection point, wherein a fifth auxiliary electric line connects the fifth connection point to the first voltage level, and the fifth auxiliary electric line further includes at least a fifth diode. The fifth diode serves to control the direction of the current through the fifth auxiliary electric line. The fifth auxiliary electric line provides a link to the first voltage level.

In some examples, the electric line of the first row comprises a sixth connection point, the sixth connection point and the second node being, at least in the substance, at the same electric potential. A sixth auxiliary electric line connects the sixth connection point to the second voltage level, and the sixth auxiliary electric line includes at least a sixth diode. The sixth diode may serve to control the direction of the current flowing through the sixth auxiliary electric line In some examples, the electric lines of the rows and the electric lines of the columns may be arranged in a passive matrix structure.

A circuit arrangement or a circuit schematic for a display is provided. In the following, the term "circuit arrangement" is only used, but, where applicable, the statements are also related to a "circuit schematic". In some examples, the circuit arrangement comprises a plurality of rows and columns, each row comprising an electric line and each column comprises an electric line, a plurality of light emitters being arranged in the plurality of rows and columns such that a light emitter of the plurality of the light emitters interconnects an electric line of a row and an electric line of a column. The circuit arrangement may further comprise a voltage supply for providing a first voltage level to the electric lines of the rows of the plurality of rows and a second voltage level to the electric lines of the columns of the plurality of columns, wherein the first voltage level is provided repeatedly and in a consecutive order to the electric lines of the rows. Furthermore, a light emitter, such as a LED, may be arranged in a first row and a first column and may interconnect the electric line of the first row and the electric line of the first column. The electric line of the first column may further comprise a current source; the current source may be adapted to be switched on and off and to provide an electric current to drive the light emitter during a predetermined period of time when the first voltage level is applied to the first row. The electric line of the first column may have a first node at which the electric line is connected to a first auxiliary electric line, the first auxiliary electric line may be connected at a first connection point to the first voltage level, and the first auxiliary electric line may comprise an auxiliary switch between the first node and the first connection point, the auxiliary switch may be switchable in dependence on a switching-off of the current source. The electric line of the first row may have a second node at which the electric line is connected to a fourth auxiliary electric line, and the fourth auxiliary electric line may be connected at a fourth connection point to the second voltage level, and the fourth auxiliary electric line may comprise a second auxiliary switch between the second node and the fourth connection point, the second auxiliary switch may be switchable in dependence on a switching-off of the first voltage level applied to the first row.

A method of operating a circuit arrangement of a display may also be provided.

In some examples, the display is a display of a video wall, a display of an electronic device, a display of a portable electronic device, such as a smartphone, or a display of a wearable electronic device, such as a smartwatch.

DETAILED DESCRIPTION OF ILLUSTRATIVE EMBODIMENTS

Figure 1:
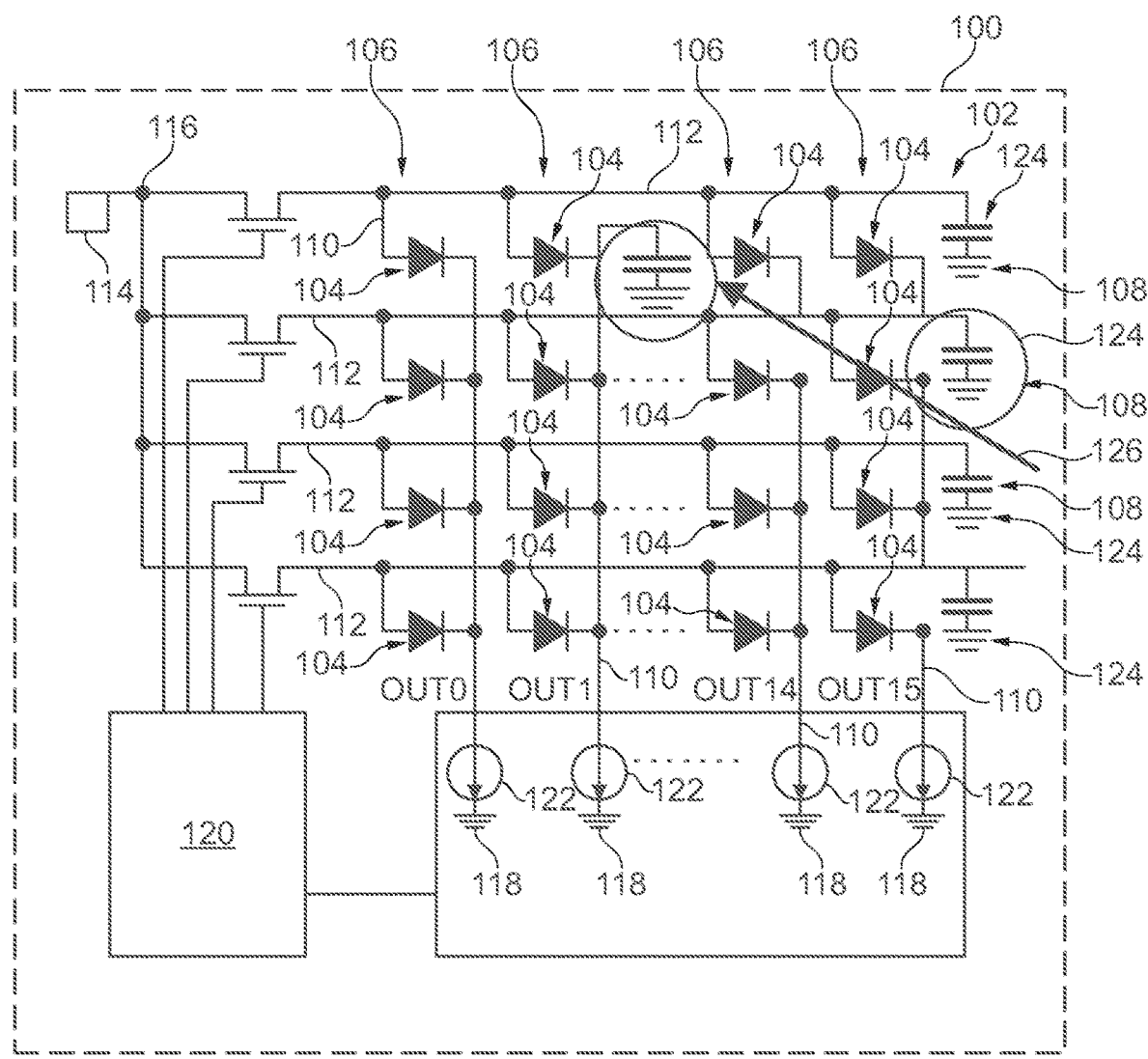
FIG. 1 illustrates a block diagram of an electronic circuit of a display.

As illustrated in FIG. 1, an electronic circuit 102 of a display 100 may, for example, be arranged on a printed circuit board (PCB) and may comprise a plurality of light emitters, here LEDs 104, which are arranged in a plurality of columns 106 and rows 108. Each row 108 comprises an electric line 112 and each column 106 comprises an electric line 110.

A voltage supply 114 is adapted to provide a first voltage level 116 to the electric lines 112 of the rows 108 and a second voltage level 118, corresponding to the ground level, to the electric lines 110 of the columns 106 as shown in FIG. 1. The display 100 comprises a microprocessor 120 which may, for example, be a digital signal processor or a field-programmable gate array and which is adapted to control the provision of the first voltage level 116 repeatedly and in a consecutive order to the electric lines 112 of the rows 108. In particular, a period of one refresh time, which corresponds to 1 over the refresh rate of the display, may be divided evenly between the rows 108 and at each moment of time only of the rows may be connected to the terminal of the voltage supply 114 which provides the first voltage level.

A LED 104 which is arranged in one of the rows 108, say a first row, and in one of the columns 106, say a first column, interconnects the electric line 112 of the first row and the electric line 110 of the first column 106. Each of the electric lines 110 of the columns 106 comprises a current source 122. A current source 122 is used to drive the LED 104 connected between its column 106 and the active row 108. It would be possible to change the level of a current linearly to control the intensity of light of that LED 104. However, this method is seldom used because of normal variations between the LEDs of the same type. A more practical approach is to use a fixed level of current in the current sources 122 and to control the light intensity of the respective LED 104 using a pulse width modulation (PWM modulation).

Parasitic capacitors 124 in the circuit, and thus, for example, in a printed circuit board, and parasitic capacitors 126 in the pn-junctions of the LEDs 104 are difficult to avoid or even inevitable. The effective parasitic capacitance on each column 106 results in an unwanted visual effect known as lower ghosting. The dominant contributor to lower ghosting is usually the capacitance between the traces in the printed circuit board. Also, the effective capacitance is mainly due to the LEDs 104, and the effective capacitance on each row 108 causes another undesirable effect known as upper ghosting.

Figure 2:
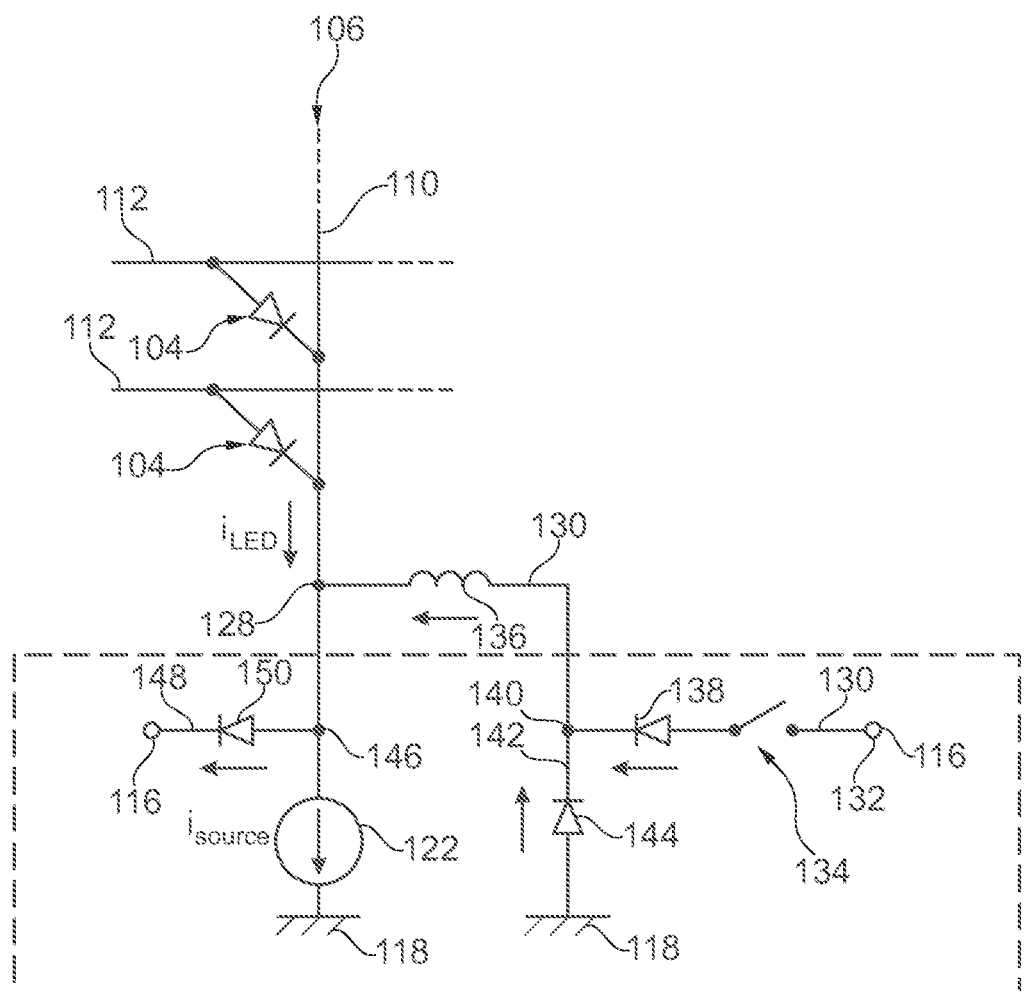
FIG. 2 illustrates a circuit diagram of a part of an electronic circuit of a display.

FIG. 2 illustrates a circuit diagram which can be a part of the electronic circuit 102 of FIG. 1. As can be seen in FIG. 2, the electric line 110 of each column 106 can have a node 128 at which the electric line 110 is connected to a first auxiliary electric line 130 which is connected at a first connection point 132 to the first voltage level 116. The first auxiliary electric line 130 comprises an auxiliary switch 134 arranged between the node 128 and the first connection point 116. The auxiliary switch 134 is switchable in dependence on a switching-off of the current source 122. The switching-off of the current source may be given by written data of the SPI bus use the LED driver.

The first auxiliary electric line 130 comprises an inductor 136 between the node 128 and the first connection point 132. The first auxiliary electric line 130 further comprises a first diode 138 with the first diode 138 and the auxiliary switch 130 being closer to the first connection point 132 than the inductor 136. The first auxiliary electric line 130 also comprises a second connection point 140 between the inductor 136 on one side of the second connection point 140 and the auxiliary switch 134 and the first diode 138 on the other side of the second connection point 140.

A second auxiliary electric line 142 connects the second connection point 140 to the second voltage level, here the ground level 118. Moreover, the second auxiliary electric line further includes a second diode 144.

The electric line 110 of each column 106 comprises a third connection point 146 arranged between the current source 122 and the light emitters 104. The third connection point 146 and the node 128 are, at least in substance, at the same electric potential. A third auxiliary electric line 148 connects the third connection point 146 to the first voltage level 116, and the third auxiliary electric line 148 includes a third diode 150.

Figure 3:
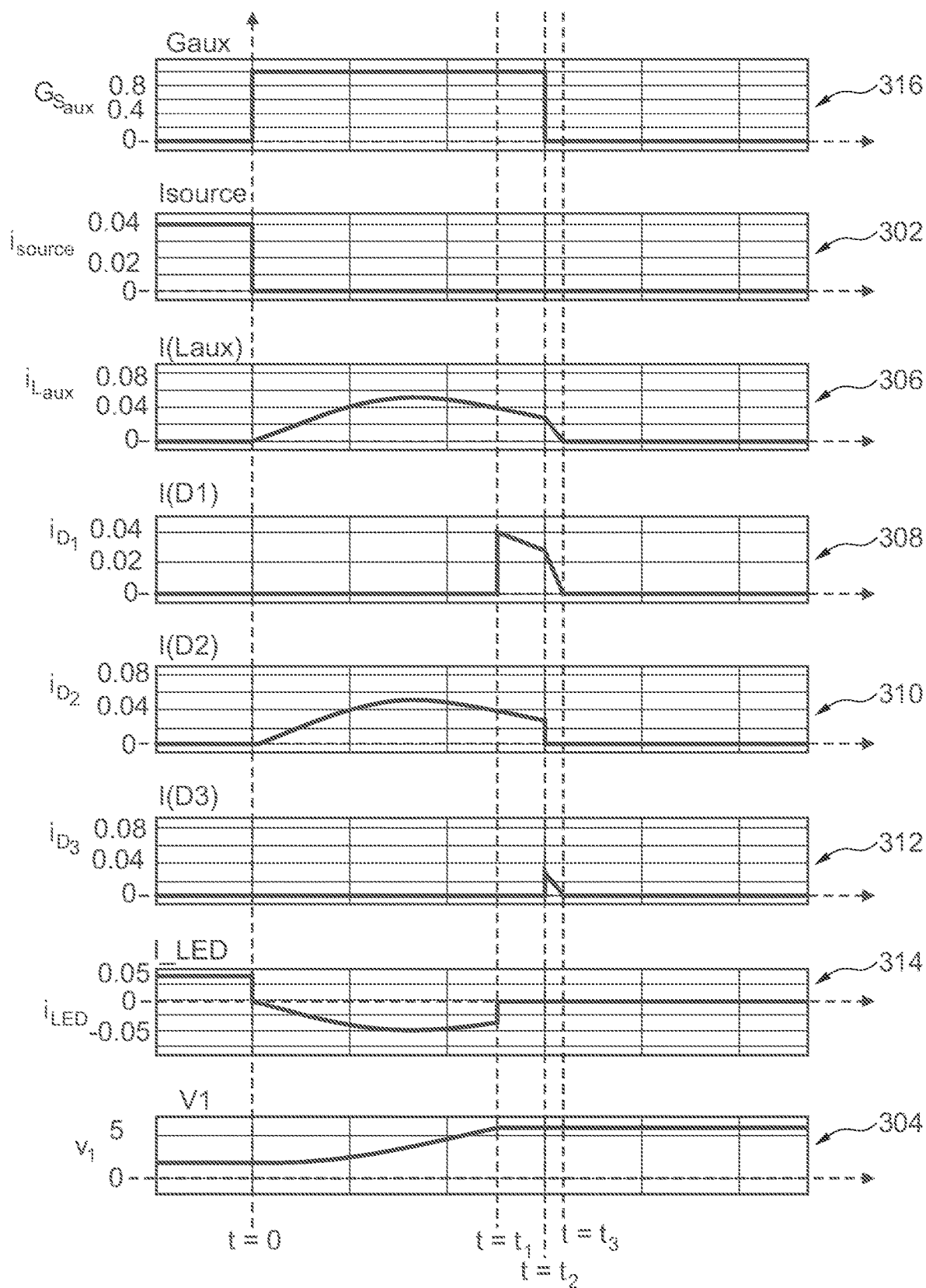
FIGS. 3 to 7 illustrate the behavior of the circuit of FIG. 2.

FIGS. 3 to 7 illustrate the behavior of the circuit of FIG. 2, according to various examples. Specifically, FIG. 3 illustrates the behavior of the circuit under ideal operating conditions. The turn-off moment of the electric current $i_{source}$ is selected as t=0 in FIGS. 3 to 7 (see graph 302). The term "ideal operating conditions", as illustrated in FIG. 3, means that the turn-on moment of the auxiliary switch 134, $S_{aux}$, happens at t=0 and thus at the same time as the turn-off moment of the current source 122 takes place. This can, for example, be implemented by use of an inverted PWM switching method. This helps to ensure that each contributor of the effective capacitance provides its load at the substantially same time.

There are three time intervals which can be identified in FIG. 3. In the first time interval, $0 \leq t < t_1$, the first diode 138 conducts and a resonance occurs between the inductor 136, $L_{aux}$, and the effective parasitic capacitance sharing the node 128. The voltage of the node 128, represented as $V_1$ (see graph 304 in FIG. 3) increases toward the first voltage level 116, also indicated as $V_{CC}$ or $V_1$. The interval ends at $t=t_1$ when $V_1 > V_{CC}$ is sufficient to bias the third diode 150.

In a second interval $t_1 \leq t < t_2$, the third diode 150 conducts and the electric current circulates between the inductor 136, the third diode 150, the first diode 138 and the auxiliary switch 134. The interval finishes at $t=t_2$ when the gate signal G of the auxiliary switch 134 is removed (see graph 316 in FIG. 3).

During the last interval $t_2 < t < t_3$, the second diode 144 conducts. The energy in the inductor 136 ($L_{aux}$) is delivered to the voltage supply 114 via the third diode 150 and the second diode 144. This interval ends at $t=t_3$ when the current in the inductor 136 reaches 0 (see graph 306).

In the diagrams of FIG. 3, graph 308 shows the time behavior of the current through the third diode 150. The third diode 150 is in the graph 308 referred to as $D_1$. Graph 310 illustrates the time behavior of the current through the first diode 144. The first diode is referred to in graph 310 as $D_2$. The time behavior of the current through the second diode 144 is illustrated in graph 312. The second diode is in graph 312 called $D_3$. Graph 314 illustrates the time behavior of the current through the driven LED 104. Graph 416 finally shows the driving signal for the auxiliary switch 134 which may, for example, be a transistor.

As can be seen from the graphs of FIG. 3, the voltage of the node 128 increases to the first level (corresponding to $V_{CC}$), see graph 304. This guarantees a forward bias of all the LEDs 104 connected to node 128 of the row 108 which are driven by the current source 122 in a time-multiplexed fashion. With the turn-off moment of the current source 122, the auxiliary switch 134 closes the first auxiliary electric line 130 and thus provides a current path from the first connection point 142 which is at the first voltage level 116 (corresponding to $V_{CC}$) to the node 128 via the inductor 136, the first diode 138 and the auxiliary switch 134. A resonance between the effective parasitic capacitors connected to the node 128 and the inductor 136 ensures that the node 128 reaches and remains at the first voltage level (corresponding to VCC, reference numeral 116 in FIG. 2) and none of the LEDs 104 connected to the column 106 will get forward biased until the current source 122 is turned on for the next time.

The diodes 144 and 150 provide a current path for the excess energy to be injected back to the voltage supply 114 after the node 128 reaches the first voltage level 116, corresponding to $V_{CC}$. Using the circuit of FIG. 2, lower ghosting effects can be reduced or even eliminated and energy can be recycled and reprovided to the voltage supply 114.

Figure 4:
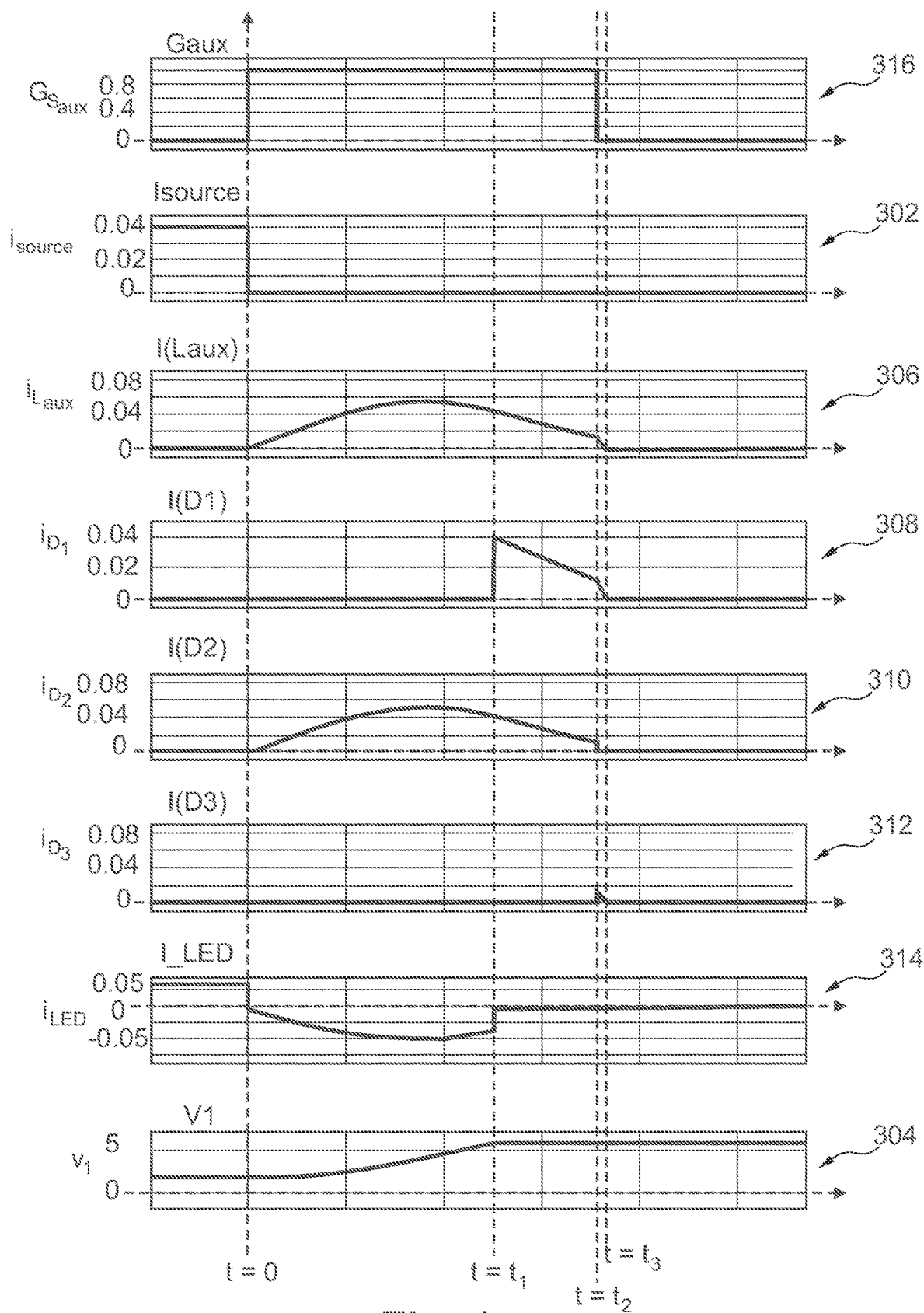
Figure 5:
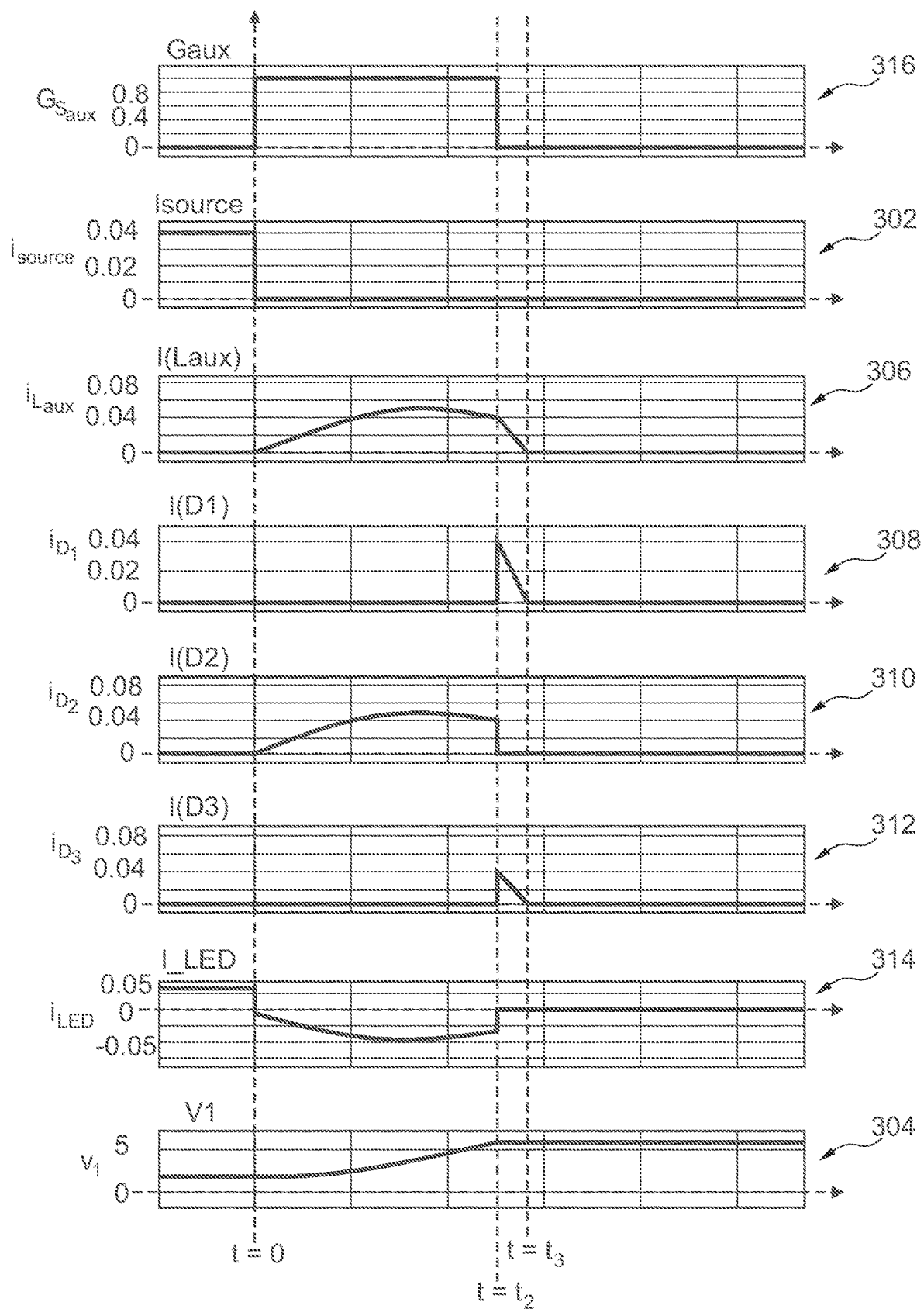

FIGS. 4 and 5 show two possible cases in which the ON-time of the auxiliary switch 144 is shorter than in the case shown in FIG. 3. FIG. 4 indicates a longer ON-time for the auxiliary switch 134 whereas FIG. 5 indicates a shorter ON-time for the auxiliary switch 134. The switch-on time can be taken from graph 316 and corresponds to the time in between t=0 and t=$t_2$. FIGS. 4 and 5 illustrate that there is in substance no impact on the functionality with a ±25% change in the duty ratio of the auxiliary switch 134. The allows using market typical devices with their typical variations in capacitance which is as a rule of thumb at around 10%.

Figure 6:
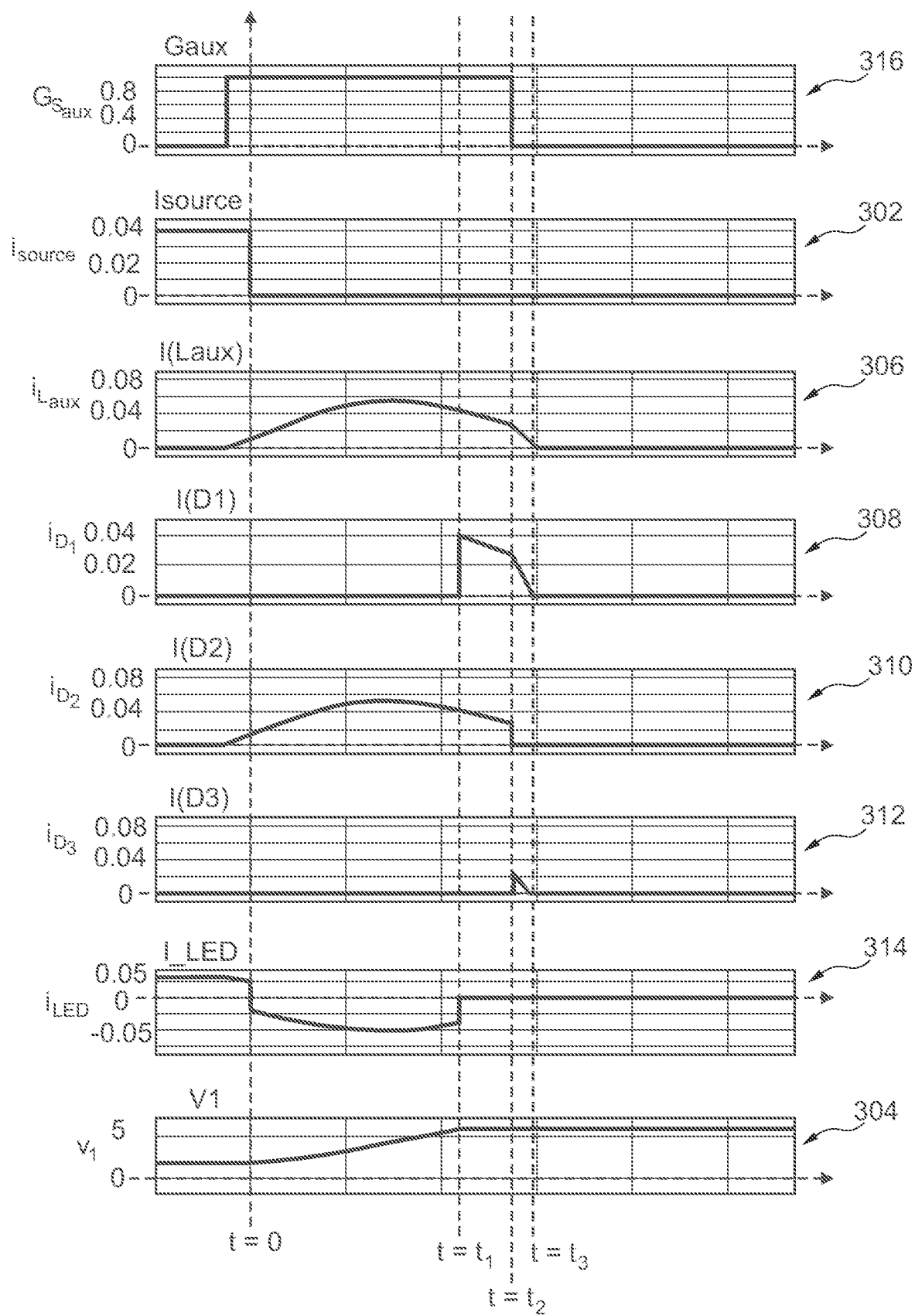
Figure 7:
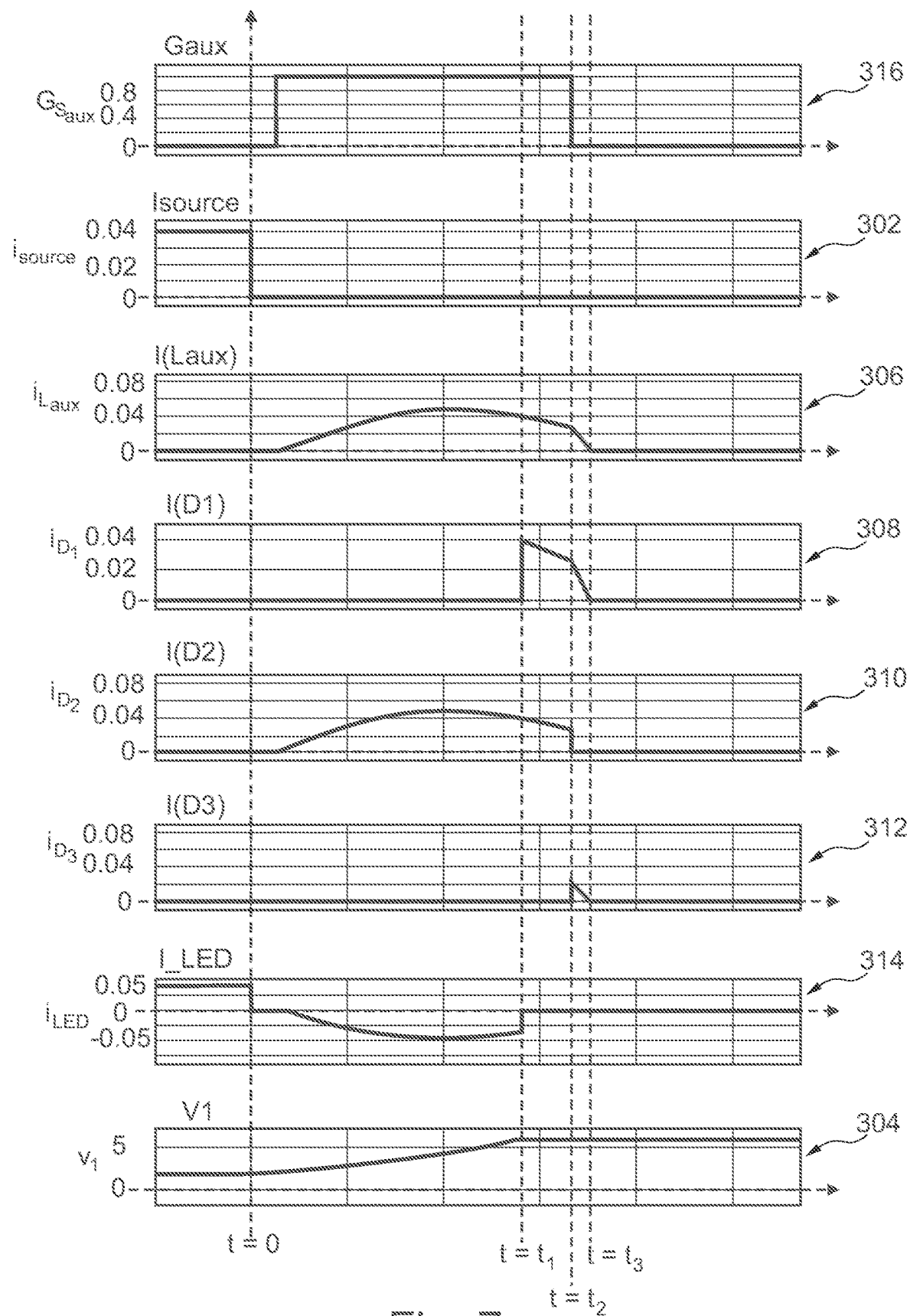

FIGS. 6 and 7 shows the waveforms in the graphs 302-316 when the turn-on moment of the auxiliary switch 134 happens before or after the turn-off moment of the current source 122. FIG. 6 illustrates the case in which the auxiliary switch is switched on shortly before the current source 122 is switched off. FIG. 7 illustrates the opposite case in which the auxiliary switch 134 is switched on shortly after the current source 121 is switched off. There is in substance no impact on the functionality with a ±10% delay between the turn-on moment of the auxiliary switch and the turn-off moment of the current source. The circuit as illustrated with regard to FIG. 2 is therefore robust against typical delays in signals.

Figure 8:
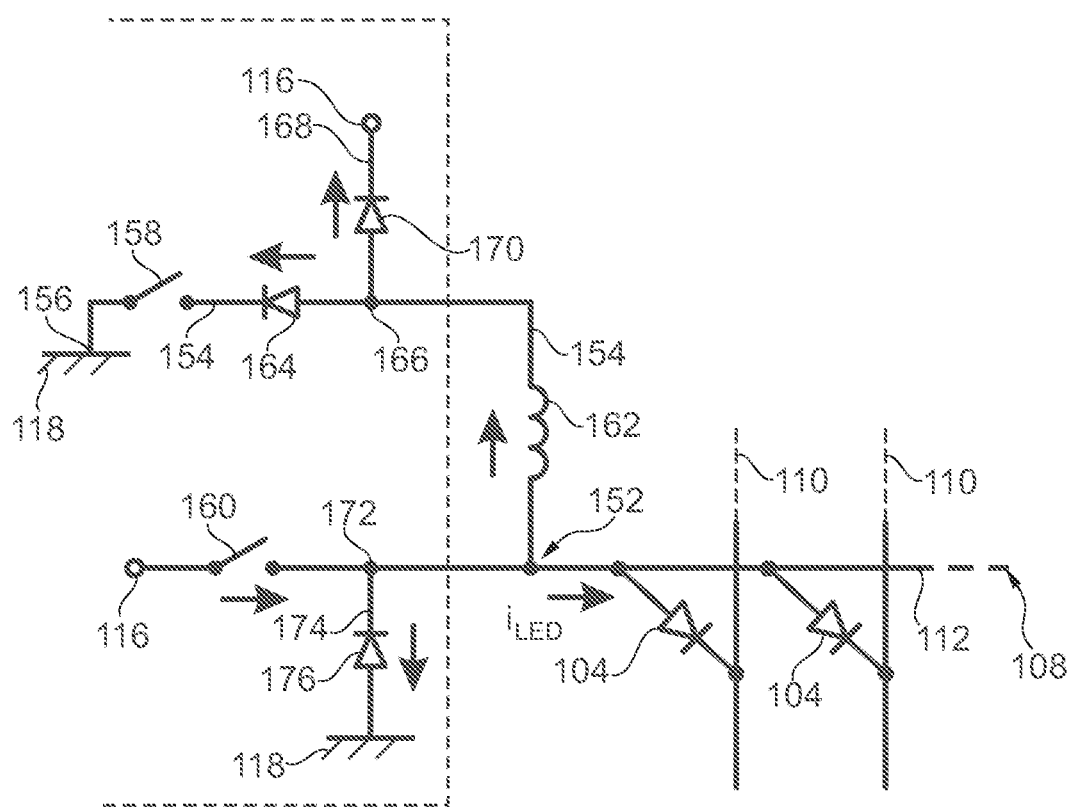
FIG. 8 illustrates a circuit diagram of a part of an electronic circuit of a display.

FIG. 8 illustrates a circuit diagram of a circuit which may be a part of the circuit 102 as shown in FIG. 1. As in particular illustrated in FIG. 8, an electric line 112 of a row 108 may comprise a second node 152 at which the electric line 112 is connected to a fourth auxiliary electric line 154 which is connected at a fourth connection point 156 to the second voltage level 118, here the ground level. The fourth auxiliary electric line 154 comprises a second auxiliary switch 158, for example, a transistor, which is arranged between the second node 152 and the fourth connection point 156. The second auxiliary switch 158 is switchable in dependence on a switching-off of the first voltage level applied to the row 108.

The electric line 112 of the row 108 is connected to a terminal of the voltage source 114 for providing the first voltage level 116 (corresponding to $V_{CC}$) to the electric line of the row 108. The electric line 112 comprises a switch 160 for connecting and disconnecting the electric line 112 of the row 108 to the terminal of the voltage source 114. The second auxiliary switch 158 is switchable in dependence on the disconnecting of the electric line 112 from the terminal of the voltage source 114. This is controlled by use of the microprocessor 120 such that the voltage level 116 is switched between the individual lines 108 consecutively as explained before.

The fourth auxiliary line 154 comprises an inductor 162 between the second node 152 and the fourth connection point 156. The fourth auxiliary line 154 further comprises a fourth diode 164 with the fourth diode 164 and the second auxiliary switch 158 being closer to the fourth connection point 156 than the inductor 162. The fourth auxiliary line 154 further comprises a fifth connection point 166 between the inductor 162 on one side of the fifth connection point 166 and the second auxiliary switch 158 and the fourth diode 164 on the other side of the fifth connection point 166. A fifth auxiliary electric line 168 connects the fifth connection point 166 to the first voltage level 116. The fifth auxiliary electric line 168 includes a fifth diode 170.

Moreover, the electric line 112 comprises a sixth connection point 172 which is, at least in substance, at the same electric potential as the second node 152. A sixth auxiliary electric line 174 connects the sixth connection point 172 to the second voltage level 118 corresponding to the ground level, and the sixth auxiliary electric line includes a sixth diode 176.

The circuit as shown in FIG. 8 is intended for upper ghosting reduction or elimination and also for energy recycling. The switch 160 activating a row 108 of LEDs 104 is operated via the microprocessor 120. After the turn-off moment of the switch 160, the voltage of the second node 152 decreases to a lower level, for example, in the range between 3.5 V and 0 V. The voltage of the second node 152 may also decrease to zero level. A decrease to a lower level which is above 0 V may help to ensure that non-active rows 108 are not heavily operated in reversed bias. Right after turn-off of the switch 160, the second auxiliary switch 158 turns on and provides a current path from the second node 152 via the inductor 162, the fourth diode 164 and the second auxiliary switch 158 to the ground or non-active voltage level at the fourth connection point 156. A resonance between the effective capacitance connected to the second node 152 and the inductor 162 ensures that the second node 152 reaches and remains at the ground level or a non-active voltage level and none of the LEDs 104 connected to the row 108 will get forward biased until the next turn-on of the switch 160. The fifth diode 170 and the sixth diode 176 provide a current path for the excess energy to be injected back to the voltage supply 114 after the second node 152 reaches the ground level or non-active voltage level.

The non-active voltage level can be a voltage level above 0 V and be, for example, in the range between 3.5 V and 0 V. An exemplary value for the non-active voltage level can be 3.3 V. When the present disclosure mentions the ground level or a switching to the ground level, this may also include the non-active voltage level or a switching to the non-active voltage level.

The dashed lines in FIGS. 2 and 8 indicate a respective portion of the circuit which can be integrated.

Figure 9:
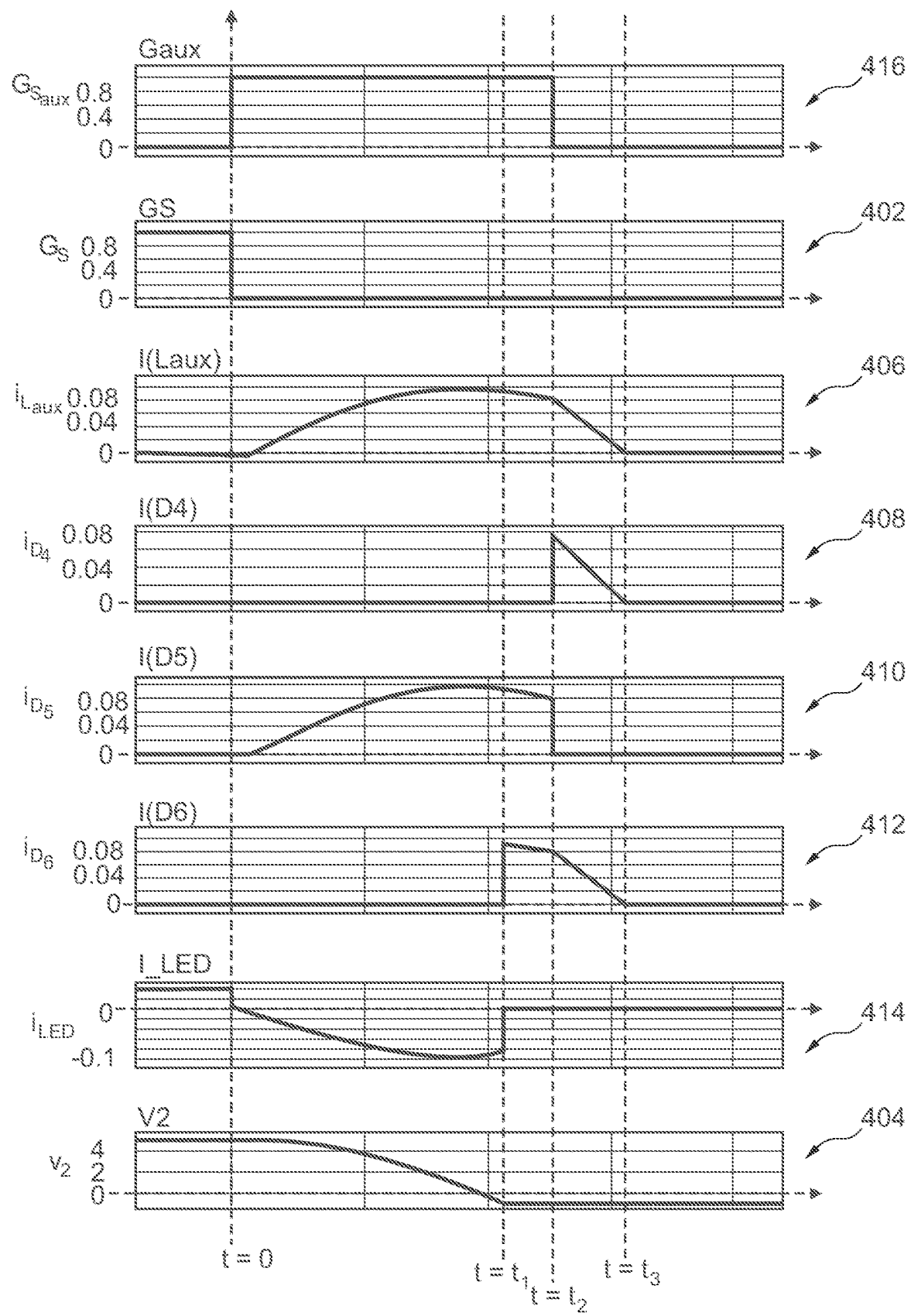
FIGS. 9 to 13 illustrate the behavior of the circuit of FIG. 8.

FIGS. 9 to 13 serve to illustrate the operation of the circuit according to FIG. 8. Specifically, FIG. 9 illustrates an ideal operation, similar as FIG. 3 illustrates the ideal case for an operation of the circuit according to FIG. 2. In FIGS. 9-13, the turn-off moment of the switch 160 is selected as t=0. Ideal operation means that the turn-on moment of the second auxiliary switch 158 ($S_{aux}$) happens at the same time as the turn-off moment of the switch 160 (S) at t=0.

There are again three intervals which can be identified in FIGS. 9-13. In the first interval, 0≤t<$t_1$, the fourth diode 164 conducts and a resonance occurs between the inductor 162

($L_{aux}$) and the effective parasitic capacitance sharing the second node 152. The voltage of the second node 152, represented as $V_2$ in graph 404 of FIG. 9, decreases toward zero. This interval ends at $t=t_1$ when $V_2<0$ is sufficient to bias the sixth diode 176.

In the second interval $t_1 \le t < t_2$, the sixth diode 176 conducts and the current circulates between the inductor 162, the fourth diode 164, the sixth diode 176 and the second auxiliary switch 158. This interval finishes at $t=t_2$ when the gate signal G of the second auxiliary switch 158 is removed. During the last interval, $t_2 \le t < t_3$, the fifth diode 170 conducts. The energy in the inductor 162 can be delivered to the voltage supply via the fifth diode 170 and the sixth diode 176. The interval ends at $t=t_3$ when the current in the inductor 162 reached zero.

An example of a typical duration of operation, from $t_0=t=t_3$ is usually less than 20 ns. Similar to the first auxiliary switch 134 in the circuit of FIG. 2, the second auxiliary switch 158 can be a low cost bipolar junction transistor adequate for the speed and current levels. The functionality of the circuit of FIG. 8 does not dependent on the position of duty ratios.

Figure 10:
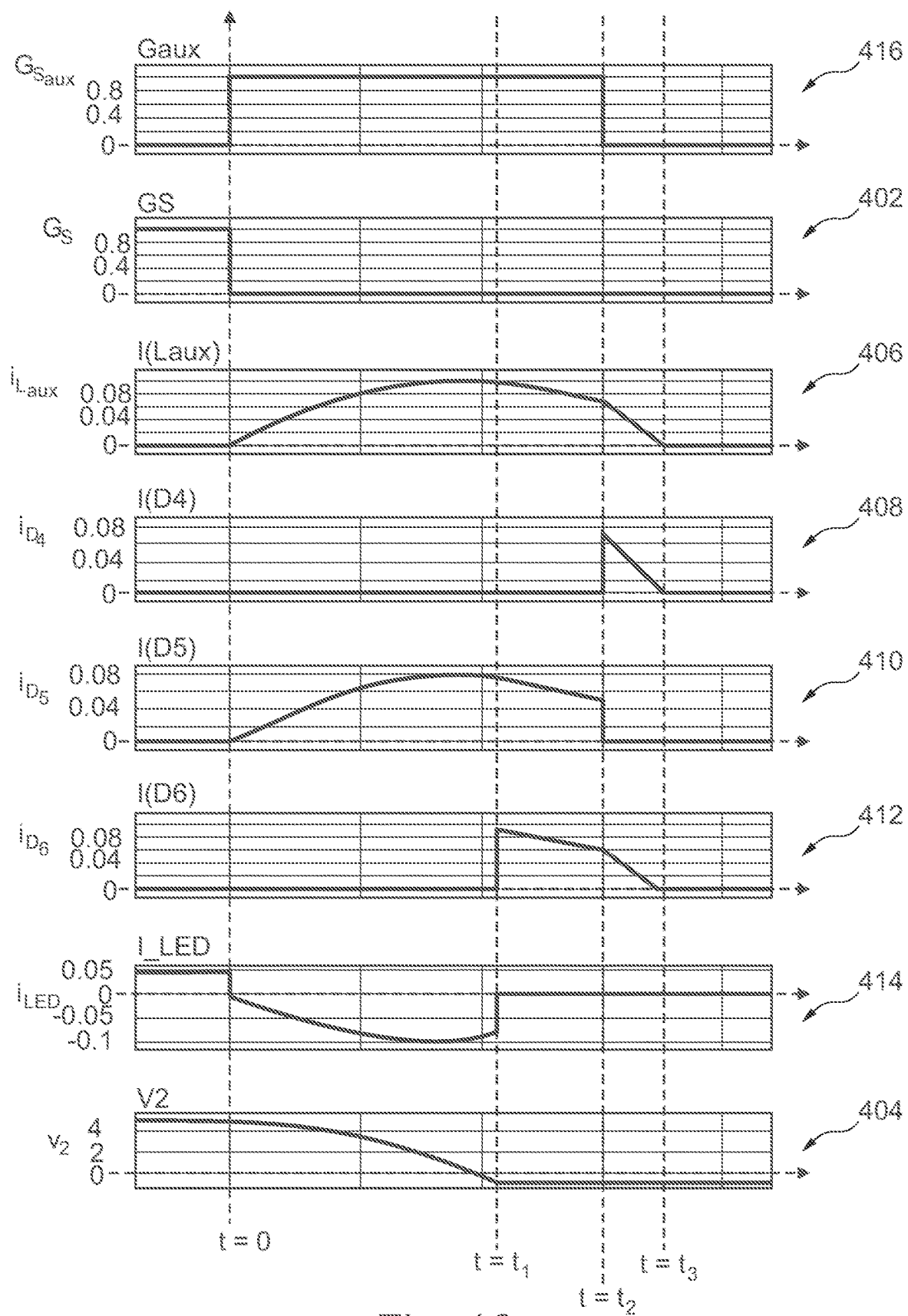
Figure 11:
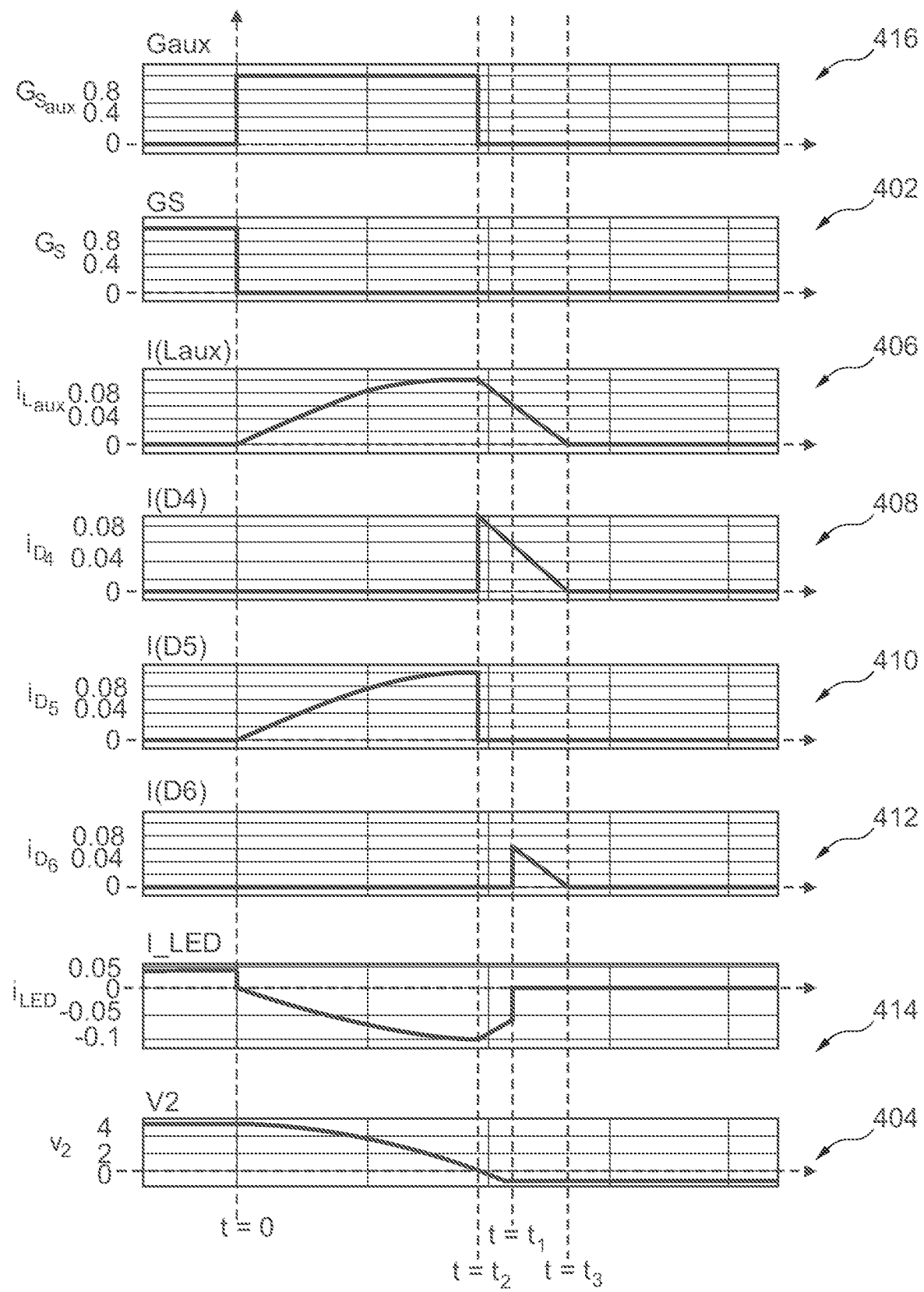

In FIGS. 10 and 11, two possible cases are shown that the ON-time of the auxiliary switch can be longer or shorter than in the case according to FIG. 9, respectively. There is basically no impact on the functionality with ±25% change in the duty ratio of the gate signal to the second auxiliary switch 158 as can be seen from the graphs 416 in FIGS. 10 and 11.

Figure 12:
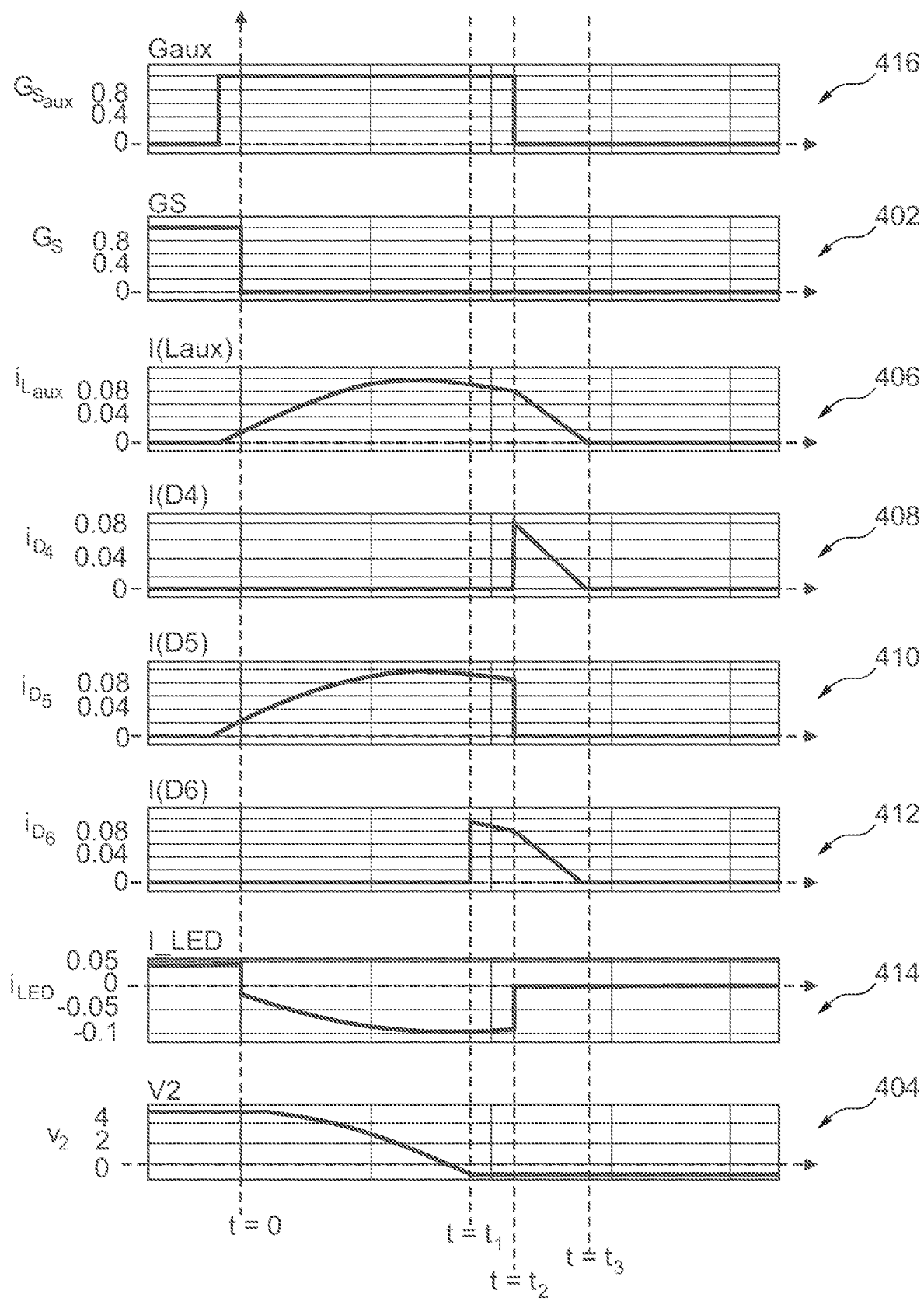
Figure 13:
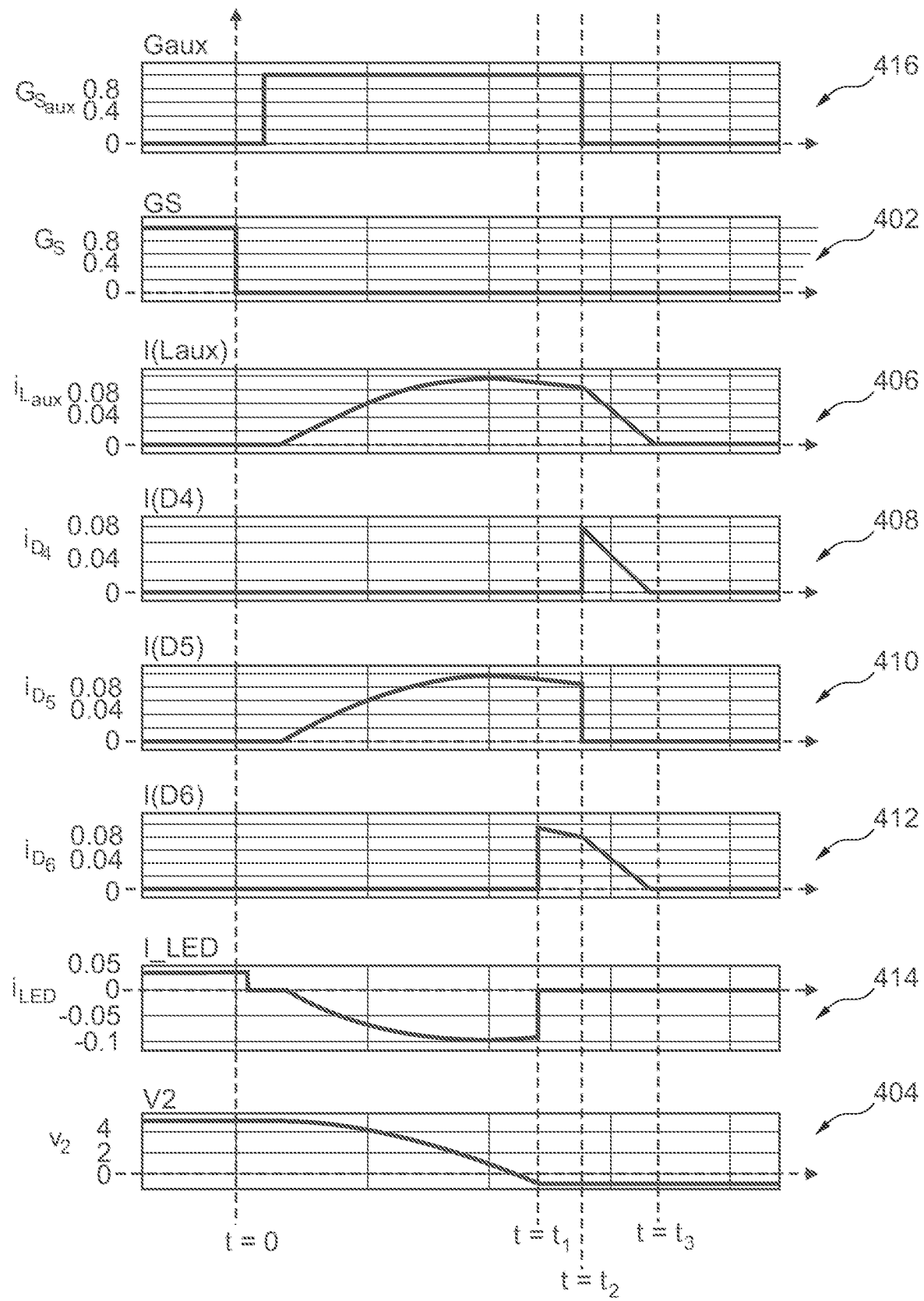

Similarly, the robustness against typical delays in signals is ensured in the set-up of FIG. 8. In FIGS. 12 and 13 the waveforms are shown when the turn-on moment of the auxiliary switch 158 happens before or after the turn-off moment of the main switch 160, respectively.

There is in substance no impact on the functionality with ±10% delay between the switching of the auxiliary switch 158 and the main switch 160.

In some examples, displays having an electronic circuit as illustrated with respect to the FIGS. 1 to 13 provide the advantage of lower or eliminated upper and lower ghosting effects in their light emitters. Moreover, for energy recuperation, only one small size, low cost inductor is required per row and column of a LED matrix. The short operation time, e.g., less than 10 ns, of the auxiliary lines and switches does not slow down the refresh rate of the display.

Moreover, in some examples, a PWM common-off state concerning the pulse-width-modulation of the current sources 122 can be used without an additional energy loss compared to a PWM common-on state. This may lead to a controlled fall-time of all light emitters in a driven row due to a carrier sweep-out with an applied reverse bias. Thus, there may be a short current density change during fall time in the active region of a LED die. The carrier sweep-out may be in the range of some picoseconds. No color shift may therefore occur over each LED and no brightness shifts may occur over different LEDs in one row leading to higher uniformity of all LEDs.

In some examples, lower heat generation can be achieved. This may lower the effect of different color shifts of different RGB LEDs.

In some examples, only few low-voltage drops at resistive components in the current path may occur at each moment. This may reduce conduction losses and maximize energy recycling efficiency. In some examples, a reduction of the duty ratio of the main switch in a row or of the current source in a column can be avoided due to the existence of the energy recycling circuitry. In some examples, the described electronic circuitry is transparent to media control hardware and software.

In some examples, the described electronic circuitry is robust against tolerances causing changes in the duration of auxiliary switch gate pulses and/or against tolerances impacting relative time order of an auxiliary switch action with respect to the main switch in a row or a current source in a column.

In some examples, the described electronic circuitry only requires one additional pin per row or column. This does not have a major impact on the circuit or PCB layout.

In some examples, the described electronic circuitry is robust against a wide variation of parasitic capacitance values due to PCB routing and/or LED junction tolerances. In some examples, a low EMI (electromagnetic interference) generation and a low susceptibility against other sources of EMI can be obtained. In some examples, the operation of the described circuits is independent of the duty ratios of the LEDs and thus fully functional for dim or bright LEDs. There is also no direct temperature dependence and no dependence on the voltages applied to the circuit.

In some examples, the described operations for avoidance of ghosting and energy recycling are operational only at the turn-off moments of the main switch with respect to an active row. A lower power consumption for the auxiliary components can thereby be achieved. The described circuitry is also highly integrable.

What is claimed is:

1. A display comprising:
a plurality of light emitters arranged in a plurality of rows and columns, each row comprising an electric line and each column comprising an electric line;
a voltage supply for providing a first voltage level to the electric lines of the rows of the plurality of rows and a second voltage level to the electric lines of the columns of the plurality of columns, wherein the first voltage level is provided repeatedly and in a consecutive order to the electric lines of the rows; and
a light emitter arranged in a first row and a first column and interconnecting the electric line of the first row and the electric line of the first column,
wherein the electric line of the first column comprises a current source, the current source being adapted to be switched on and off and to provide an electric current to drive the light emitter during a predetermined period of time when the first voltage level is applied to the first row,
wherein the electric line of the first column has a node at which the electric line is connected to a first auxiliary electric line, the first auxiliary electric line being connected at a first connection point to the first voltage level, the first auxiliary electric line comprising an auxiliary switch between the node and the first connection point and the auxiliary switch being switchable in dependence on a switching-off of the current source,
wherein the electric line of the first column comprises a third connection point, wherein the third connection point and the node are at the same electric potential, wherein a third auxiliary electric line connects the third connection point to the first voltage level, and wherein the third auxiliary electric line includes at least a third diode.

2. The display of claim 1, wherein the first auxiliary electric line further comprises an inductor between the node and the first connection point.

3. The display of claim 2, wherein the first auxiliary electric line further comprises a first diode, and wherein the first diode and the auxiliary switch are closer to the first connection point than the inductor.

4. The display of claim 3, wherein the first auxiliary electric line comprises a second connection point between the inductor on one side of the second connection point and the auxiliary switch and the first diode on the other side of the second connection point.

5. The display of claim 4, further comprising a second auxiliary electric line connecting the second connection point to the second voltage level, wherein the second auxiliary electric line further includes at least a second diode.

6. The display of claim 1, wherein the auxiliary switch is switchable in dependence on a switching rate of the first voltage level between consecutive rows.

7. A display comprising:
a plurality of light emitters arranged in a plurality of rows and columns, each row comprising an electric line and each column comprising an electric line; and
a voltage supply for providing a first voltage level to the electric lines of the rows of the plurality of rows and a second voltage level to the electric lines of the columns of the plurality of columns, wherein the first voltage level is provided repeatedly and in a consecutive order to the electric lines of the rows,
wherein the electric line of a first row of the plurality of rows has a second node at which the electric line of the first row is connected to a fourth auxiliary electric line, the fourth auxiliary electric line being connected at a fourth connection point to the second voltage level, the fourth auxiliary electric line comprising a second auxiliary switch between the second node and the fourth connection point, and the second auxiliary switch being switchable in dependence on a switching-off of the first voltage level applied to the first row,
wherein the electric line of the first row comprises a sixth connection point, wherein the sixth connection point and the second node are at the same electric potential, wherein a sixth auxiliary electric line connects the sixth connection point to the second voltage level, and wherein the sixth auxiliary electric line includes at least a sixth diode.

8. The display of claim 7, wherein the electric line of the first row is connected to a terminal of the voltage supply for providing the first voltage level to the electric line of the first row, wherein the electric line comprises a switch for connecting and disconnecting the electric line of the first row to the terminal of the voltage supply, and wherein the second auxiliary switch is switchable in dependence on the disconnecting of the electric line of the first row from the terminal of the voltage supply.

9. The display of claim 7, wherein the fourth auxiliary electric line comprises an inductor between the second node and the fourth connection point.

10. The display of claim 9, wherein the fourth auxiliary electric line further comprises a fourth diode, and wherein the fourth diode and the second auxiliary switch are closer to the fourth connection point than the inductor.

11. The display of claim 10, wherein the fourth auxiliary electric line comprises a fifth connection point between the inductor on one side of the fifth connection point and the second auxiliary switch and the fourth diode on the other side of the fifth connection point, wherein a fifth auxiliary electric line connects the fifth connection point to the first voltage level, and wherein the fifth auxiliary electric line further including at least a fifth diode.

12. A circuit arrangement for a display, the circuit arrangement comprising:
a plurality of rows and columns, each row comprising an electric line and each column comprising an electric line, a plurality of light emitters arranged in the plurality of rows and columns such that a light emitter of the plurality of light emitters interconnects an electric line of a row and an electric line of a column; and
a voltage supply for providing a first voltage level to the electric lines of the rows of the plurality of rows and a second voltage level to the electric lines of the columns of the plurality of columns, wherein the first voltage level is provided repeatedly and in a consecutive order to the electric lines of the rows,
wherein a light emitter is arranged in a first row and a first column and interconnects the electric line of the first row and the electric line of the first column,
wherein the electric line of the first column comprises a current source, the current source being adapted to be switched on and off and to provide an electric current to drive the light emitter during a predetermined period of time when the first voltage level is applied to the first row,
wherein the electric line of the first column has a first node at which the electric line is connected to a first auxiliary electric line, the first auxiliary electric line being connected at a first connection point to the first voltage level, the first auxiliary electric line comprising an auxiliary switch between the first node and the first connection point, and the auxiliary switch being switchable in dependence on a switching-off of the current source, and
wherein the electric line of the first row has a second node at which the electric line is connected to a fourth auxiliary electric line, the fourth auxiliary electric line being connected at a fourth connection point to the second voltage level, the fourth auxiliary electric line comprising a second auxiliary switch between the second node and the fourth connection point, and the second auxiliary switch being switchable in dependence on a switching-off of the first voltage level applied to the first row,
wherein the electric line of the first column comprises a third connection point, wherein the third connection point and the first node are at the same electric potential, wherein a third auxiliary electric line connects the third connection point to the first voltage level, and wherein the third auxiliary electric line includes at least a third diode.

13. A method of operating a circuit arrangement of a display, wherein the circuit arrangement comprises a plurality of rows and columns, each row comprising an electric line and each column comprising an electric line, a plurality of light emitters arranged in the plurality of rows and columns such that a light emitter of the plurality of light emitters interconnects an electric line of a row and an electric line of a column, the method comprising:
providing a first voltage level to the electric line of a first row of the plurality of rows and a second voltage level to the electric lines of a first column of the plurality of columns;
while providing the first voltage level to the electric line of the first row:
operating a current source arranged in the electric line of the first column to light up a light emitter which is arranged in the first row and the first column and interconnects the electric line of the first row and the electric line of the first column;

switching off of the current source;

in dependence on switching off the current source, operating an auxiliary switch arranged in a first auxiliary electric line, the electric line of the first column having a first node at which the electric line is connected to the first auxiliary electric line, and the first auxiliary electric line being connected at a first connection point to the first voltage level;

stopping providing the first voltage level to the electric line of the first row; and in dependence on stopping providing the first voltage level to the electric line of the first row, switching on a second auxiliary switch in a fourth auxiliary electric line, the electric line of the first row having a second node at which the electric line is connected to the fourth auxiliary electric line, and the fourth auxiliary electric line being connected at a fourth connection point to the second voltage level.

14. The method of claim 13, wherein the auxiliary switch is switchable in dependence on a switching rate of the first voltage level between consecutive rows.

15. The method of claim 13, wherein the first auxiliary electric line further comprises an inductor between the node and the first connection point and a first diode, and wherein the first diode and the auxiliary switch are closer to the first connection point than the inductor.

\* \* \* \* \*